United States Patent
Anderson et al.

(10) Patent No.: US 10,442,037 B2
(45) Date of Patent: Oct. 15, 2019

(54) PB-FREE SN—AG—CU—AL OR SN—CU—AL SOLDER

(71) Applicant: Iowa State University Research Foundation, Inc., Ames, IA (US)

(72) Inventors: Iver E. Anderson, Ames, IA (US); Joel L. Harringa, Ames, IA (US); Adam J. Boesenberg, Ankeny, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 14/544,833

(22) Filed: Feb. 24, 2015

(65) Prior Publication Data

US 2015/0231741 A1    Aug. 20, 2015

Related U.S. Application Data

(62) Division of application No. 13/066,748, filed on Apr. 22, 2011, now abandoned.

(60) Provisional application No. 61/343,135, filed on Apr. 23, 2010.

(51) Int. Cl.
| | |
|---|---|
| *B23K 35/26* | (2006.01) |
| *C22C 13/00* | (2006.01) |
| *B23K 35/00* | (2006.01) |
| *B23K 35/02* | (2006.01) |
| *H05K 3/34* | (2006.01) |

(52) U.S. Cl.
CPC .......... *B23K 35/262* (2013.01); *B23K 35/001* (2013.01); *B23K 35/0244* (2013.01); *C22C 13/00* (2013.01); *H05K 3/3463* (2013.01)

(58) Field of Classification Search
CPC .................................................. B23K 35/262
See application file for complete search history.

(56) References Cited

U.S. PATENT DOCUMENTS

| | | | | |
|---|---|---|---|---|
| 1,869,378 | A | * 8/1932 | Konigsberg | ............ C22C 13/00 420/561 |
| 4,443,274 | A | * 4/1984 | Brock | ....................... C23C 8/10 148/242 |
| 5,527,628 | A | 6/1996 | Anderson et al. | ............. 428/647 |
| 6,231,691 | B1 | 5/2001 | Anderson et al. | ............. 148/400 |
| 6,805,974 | B2 | * 10/2004 | Choi | ..................... B23K 35/262 428/646 |
| 7,282,175 | B2 | 10/2007 | Amagai et al. | ................ 420/562 |

FOREIGN PATENT DOCUMENTS

| | | | |
|---|---|---|---|
| DE | 19538365 A1 | * 4/1997 | ............. C22C 13/00 |
| JP | 2004-261863 | 9/2004 | |

OTHER PUBLICATIONS

W. Liu et al., The Effects of Additives to SnAgCu Alloys on Microstructure and Drop Impact Reliability of Solder Joints, JOM, 59, No. 7, (2007), pp. 26-31.

(Continued)

*Primary Examiner* — Devang R Patel

(57) ABSTRACT

A solder alloy includes Sn, optional Ag, Cu, and Al wherein the alloy composition is controlled to provide a strong, impact-and thermal aging-resistant solder joint that has beneficial microstructural features and is substantially devoid of $Ag_3Sn$ blades.

3 Claims, 14 Drawing Sheets

(56) References Cited

OTHER PUBLICATIONS

L.-W. Lin et al., Alloying modification of Sn—Ag—Cu solders by manganese and titanium, Microelectron. Reliab.49 (2009),pp. 235-241.

W. Liu et al., the Superior Drop Test Performance of SAC-Ti Solders and Its Mechanism, Proc. 58th Electronic Comonents and Technology Conference, (2008), pp. 452-458.

K.N. Tu et al., Physics and materials challenges for lead-free solders, J. Appl. Phys. 93, (2003), pp. 1335-1353.

S.K. Kang et al., Microstructure and mechanical properties of lead-free solders and solder joints used in microelectronic applications, IBM J. Res. Dev. 49, (2005), pp. 607-620.

C. Anderson et al., Comparison of isothermal mechanical fatigue properties of lead-free solder joints and bulk solders, Mater. Sci. Eng. A 394,(2005) pp. 20-27.

I.E. Anderson, Development of Sn—Ag—Cu and Sn—Ag—Cu—X alloys for Pb-free electronic solder applications, J. Mater. Sci. Mater. Electron. 18, (2007) pp. 55-76.

K.-W. moon et al., Experimental and Thermodynamic Assessment of Sn—Ag—Cu Solder Alloys, J. Electron. Mater. 29 (2000) pp. 1122-1136.

Swenson, The effects of suppressed beta tin nucleation on the microstructural evolution of lead-free solder joints, J. Mater. Sci. Mater. Electron. 18, (2007), pp. 39-54.

I.E. Anderson et al., Obervations of Nucleation Catalysis Effects during Solidification of SnAgCuX Solder Joints, JOM 59, (2007), pp. 38-43.

S.K. Kang et al., Study of the undercooling of Pb-free, flip-chip solder bumps and in situ observation of solidification process, J. Mater. Res. 22, (2007), pp. 557-560.

I.E. Anderson et al., Alloying Effects in Near-Eutectic Sn—Ag—Cu Solder Alloys for Imrpoved Microstructural Stability, J. Electron. Mater. 30, (2001), pp. 1050-1059.

J.K Walleser, Microstructure control of the Sn—Ag—Cu-X solder alloy system through nucleation catalysis of Sn, M.S. Thesis, Mat. Sci. & Eng. Dept., Iowa State University, 2008.

I.E. Anderson et al., Suppression of Void Coalescence in Thermal Aging of Tin-Silver-Copper-X Solder Joints, J. Electron. Mater. 35, (2006), pp. 94-106.

A. Ohno et al., J. Jpn Inst. Metals 37, (1973), pp. 777-780. Materials Preparation Center, A.L.; US DOE Basic Energy Sciences, Ames, IA, USA. Available from: www.mpc.ameslad.gov.

O. Unal et al., Application of an Asymetrical Four Point Bend Shear Test to Solder Joints, J. Electron. Mater. 30, (2001), pp. 1206-1213.

I.E. Anderson et al., Alloy Design of Sn—Ag—Cu+X Soler to Promote Eutectuc Solidification, Proc. 4th Int. Braz. Solder Conf., (ASM Int./AWS, 2009) pp. 68-73, ISBN: 978-0-87171-751-1.

S.K. Kang et al., $Ag_3Sn$ Plate Formation in the Solidification of Near-Ternary Eutectic Sn—Ag—Cu, JOM 55, (2003), pp. 61-65.

J.-M. Song et al., Chrystallization, morphology and distribution of $Ag_3Sn$ in Sn—Ag—Cu alloys and their influence on the virbration fracture properties, Mater. Sci. Eng. A 466, (2007), pp. 9-17.

E. De Monlevade et al., Failure Mechanisms and Crack Propagation Paths in Thermally Aged Pb-Free Solder Interconnects, J. Electron. Mater. 36, (2007), pp. 783-797.

K.S. Kim et al., Effects of intermetallic compounds on properties of Sn—Ag—Cu lead-free solder joints, J. Alloys Comp. 352, (2003), pp. 1226-1236.

J. de Sousa et al., The influence of low level doping on the thermal evolution of SAC alloy solder joints with Cu pad structures Proc. 56th Electron. Comp. Tech. Conf. (IEEE, 2006) pp. 1454-1461, ISBN: 1-4244-0152-6.

Anderson et al., "Near-eutectic Sn—Ag—Cu-X Solder Joints Alloy Design", Journal of Electronic Materials, vol. 38, No. 12,2009.

Boesenberg, A. J., "Development of Al, Mn & Zn doped Sn—Ag—Cu-X solders for electronic assembly", MS Thesis, Iowa State University, defense date May 5, 2011.

* cited by examiner

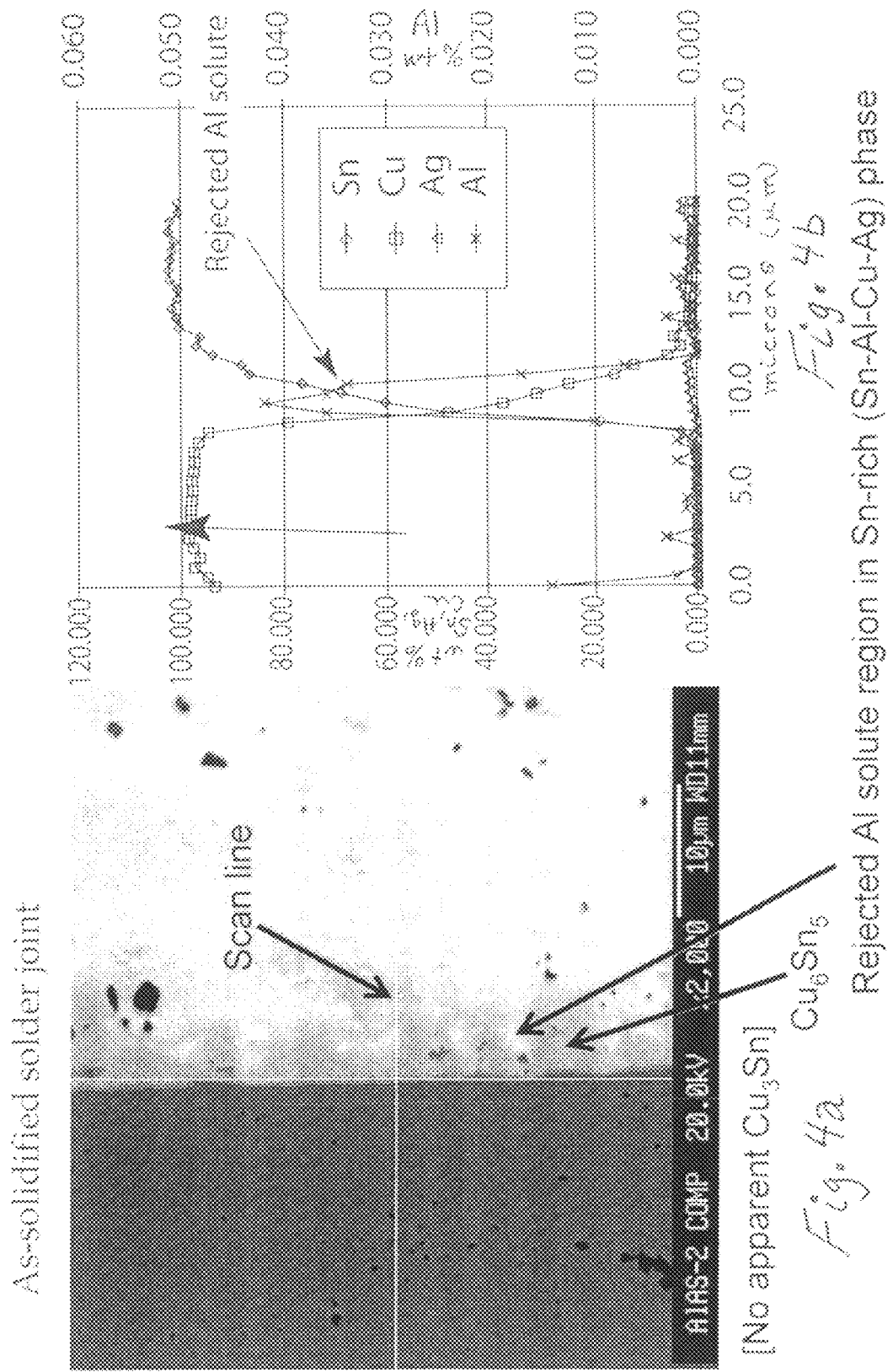

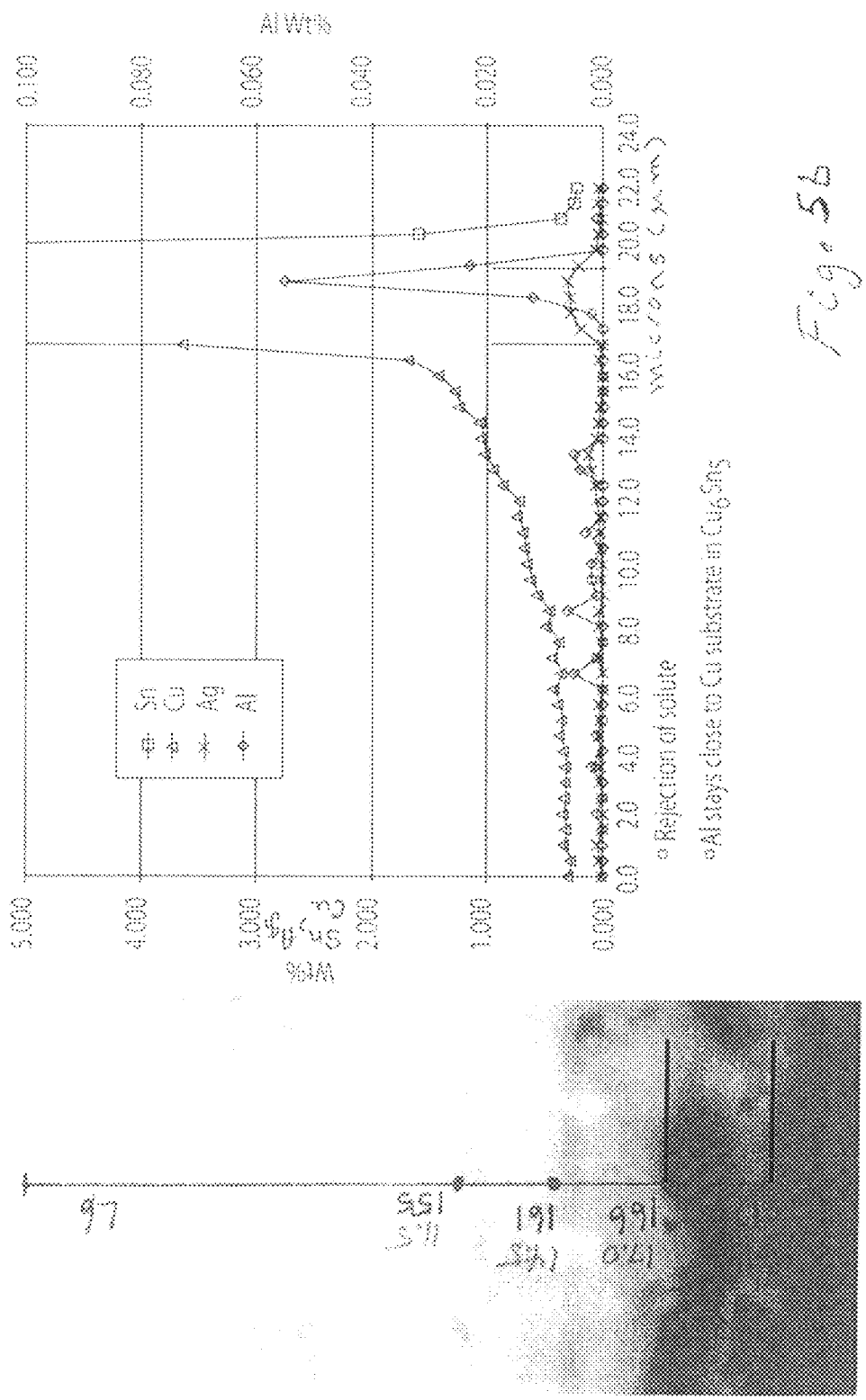

PB-FREE SN—AG—CU—AL OR SN—CU—AL SOLDER

This application is a division of copending patent application Ser. No. 13/066,748 filed Apr. 22, 2011, which claims benefits and priority of U.S. provisional application Ser. No. 61/343,135 filed Apr. 23, 2010, the disclosure of which is incorporated herein by reference.

CONTRACTUAL ORIGIN OF THE INVENTION

This invention was made with government support under Contract No. DE-AC02-07CH11358 awarded by the U. S. Department of Energy. The government has certain rights in the invention.

FIELD OF THE INVENTION

The present invention provides a Pb-free solder alloy (Sn—Ag—Cu—Al or Sn—Cu—Al) that displays reliable joint solidification control to provide a strong, impact-and thermal aging-resistant solder joint having beneficial microstructural features and substantially devoid of $Ag_3Sn$ blades and that is useful for joining electronic assemblies and electrical contacts and to substitute for Pb-containing solders in all surface mount solder assembly operations, including solder paste reflow and ball grid array joints.

BACKGROUND OF THE INVENTION

The global electronic assembly community is striving, to accommodate the replacement of Pb-containing solders, primarily Sn—Pb alloys, with Pb-free solders due to environmental regulations and market pressures. During this major transition away from eutectic or near-eutectic Sn—Pb solder ($T_{eut}$=183° C.) for electronic assembly, there is also the opportunity to make a major improvement in Pb-free joint reliability for challenging operating environments, i.e., high temperatures and stress levels, as well as impact loading situations. Of the Pb-free choices, an array of solder alloys based on the Sn3.7Ag-0.9Cu (in wt. %) ternary eutectic ($T_{eut}$=217° C.) composition have emerged with the most potential for broad use across the industry. U.S. Pat. No. 5,527,628 describes such Pb-free solder alloys.

The electronics industry has seized the challenge of adaptation and is proceeding rapidly to develop the assembly techniques and to generate the reliability data for tin-silver-copper (SAC) alloy solder as a favored Pb-free solder in many electronic assembly applications. Compared with Sn—Pb solders that have been limited typically to low-stress joints and reduced-temperature service because of the soft Pb phase that is prone to coarsening and ductile creep failure, the high Sn content and strong intermetallic phases of a well-designed SAC alloy solder can promote enhanced joint shear strength and creep resistance and can permit an increased operating temperature envelope for advanced electronic systems and devices.

Results of SAC alloy development have demonstrated increased shear strength at ambient temperature and elevated temperatures, e.g., 150° C. Joints made from a variety of SAC solders have also demonstrated resistance to isothermal fatigue and resistance to degradation of shear strength from thermal aging for temperature excursions up to 150° C., a current test standard for under-the-hood automotive electronics solder.

An observation that arose from initial widespread testing of SAC solder alloys was the occasional embrittlement of SAC solder joints due to micro-void nucleation, growth, and coalescence, if the exposure to elevated temperatures was sufficiently high, typically greater than about 150° C., and the exposure was sufficiently long, greater than about 500 to 1000 h (hours). This occasional joint embrittlement after thermal aging was observed at elevated Cu content in SAC solder alloys and typically was associated with excessive growth of layers of Cu-base intermetallic compounds, $Cu_6Sn_5$ and, especially, $Cu_3Sn$. It should be noted that U.S. Pat. No. 6,231,691 provides a solder to suppress this thermal aging phenomenon through minor additions (<1 wt. %, but usually 0.2-0.3 wt. %) of a fourth element, such as Ni, Fe, and/or Co, and "like-acting elements," to the SAC solder to suppress solid state diffusion at the solder/substrate interface that contains the Cu-base intermetallic compound layers. Later testing showed that a Mn addition was one of the most effective like-acting elemental additions, suppressing growth of both types of intermetallic layers after extensive thermal aging. This type of minor alloy addition to prevent embrittlement has become increasingly important since narrow solder joint gaps are becoming more common with miniaturization of electronic circuits.

Studies have shown that Sn dendrites are the dominant as-solidified microstructure feature in solder joints made with many SAC alloys, not a fine (ternary) eutectic, contrary to the previous experience with Sn—Pb. Also, it was found that relatively high but variable undercooling was observed commonly before joint solidification leading to Sn dendrites with spacing variations (that depend on undercooling and growth rate) but with very few distinct Sn grains. The unusually high undercooling of the SAC solder joints was associated with the difficulty of nucleating Sn solidification, as a pro-eutectic phase. Especially during slow cooling, e.g., in ball grid array (BGA) joints Where cooling rates are less than 0.2° C./s, increased undercooling of the joints also can promote formation of undesirable pro-eutectic intermetallic phases, specifically $Ag_3Sn$ "blades," that tend to coarsen radically, leading to embrittlement of as-solidified solder joints:

References 1, 2, 3, and 4 listed below employed fourth element additions to SAC solders with the intention of avoiding $Ag_3Sn$ blades by selecting SAC compositions that were deficient in Ag and Cu, e.g., see SAC2705 [see ref. 4], SAC305, and SAC 105 [see refs. 1,2,3]. These references include the following:

1. A. W. Liu and N-C. Lee, "The Effects of Additives to Sn—Ag—Cu Alloys on Microstructure and Drop Impact Reliability of Solder Joints," JOM, 59, no. 7 (2007) pp. 26-31
2. B. L-W. Lin et al., "Alloying modification of Sn—Ag—Cu solders by manganese and titanium," Microelectron. Reliab. (2008), doi:10.1016/j.microrel.2008.10.001.
3. C. W. Liu, P. Bachorik, and N-C. Lee, "The Superior Drop Test Performance of SAC-Ti Solders and Its' Mechanism;" Proc 58th Electronic Components and Technology Conf, (2008), pp. 627-635.
4. D. S. K. Kang, P. A. Lauro, D.-Y. Shih, D. W. Henderson, K. J. Puttlitz, IBM J. Res. Dev. 49(4/5), 607-620 (2005).

In these references, some marginally near-eutectic SAC alloy designs were proposed with a low Cu level (0.5%) and very low Ag levels, less than 2.7% Ag [ref 4] and down to 1% Ag (SAC 105). These base alloys were selected since they would tend to promote Sn formation and inhibit nucleation of $Ag_3Sn$ [ref 1, 2, 3, 4]. Because these alloys deviate increasingly from the eutectic, they exhibit a wider melting range (mushy zone) with a liquidus temperature (for SAC 105) as high as 226° C. Unfortunately, some observations of unmodified SAC 105 interfacial failure on impact loading still occurred, since occasional high undercooling still may permit $Ag_3Sn$ blade formation during slow cooling. These "interfacial adhesion" failures prompted attempts at alloy modifications of SAC 105 solder with 1-2 additions [refs. 1,2] to improve impact resistance of BGA joints by increasing the interfacial bond strength of the intermetallic layer and, presumably, by suppressing $Ag_3Sn$ blade formation. While significant improvement in impact resistance was observed, especially for SAC105+0.13% Mn and SAC105+0.02% Ti alloys [ref. 3] (and no Ag3Sn blades were reported), their high liquidus temperature (approximately 226° C.) and wide liquid-solid mushy zone (equal to 9° C. because of the 217° C. solidus temperature) inhibits broad service application.

SUMMARY OF THE INVENTION

In an embodiment, the present invention provides a solder alloy comprising Sn, optional Ag, Cu, and Al wherein the alloy composition is controlled to provide a strong, impact and thermal aging-resistant solder joint having beneficial microstructural features and substantially devoid of $Ag_3Sn$ blades.

An illustrative embodiment of the invention provides a solder alloy consisting essentially of about 3 to about 4 weight % Ag, about 0.7 to about 1.7 weight % Cu, about 0.01 to about 0.25 weight % Al, and balance consisting essentially of Sn. A preferred solder alloy consists essentially of about 3.4 to about 3.6 weight % Ag, about 0.8 to about 1.1 weight % Cu, about 0.03 to about 0.20 weight % Al, and balance consisting essentially of Sn. A still more preferred solder alloy consists essentially of about 3.45 to about 3.55 weight % Ag, about 0.9 to about 1.0 weight % Cu, about 0.04 to about 0.10 weight % Al, and balance consisting essentially of Sn. Another still more preferred solder alloy consists essentially of about 3.45 to about 3.55 weight % Ag, about 0.75 to about 1.0 weight % Cu, about 0.04 to about 0.15 weight % Al, and balance consisting essentially of Sn.

Another illustrative embodiment of the invention provides a solder alloy consisting essentially of about 3 to about 4 weight % Ag, 0.95-y weight % Cu, and y weight % Al and balance consisting essentially of Sn wherein y is about 0.01 to about 0.25 weight %.

Still another embodiment of the invention provides a still more preferred solder alloy consists essentially of about 3.45 to about 3.55 weight % Ag, about 0.80 to about 1.0 weight % Cu, about 0.10 to about 0.20 weight % Al, and balance consisting essentially of Sn, especially for BGA applications that involve thermal-mechanical fatigue environments, like avionics.

The invention also envisions a modification of the alloy formulation to eliminate the Ag component for situations where higher solder melting alloys can be tolerated. Such modified embodiment provides a solder alloy consisting essentially of about 0.7 to about 3.5 weight % Cu, about 0.01 to about 0.25 weight % Al, and balance consisting essentially of Sn. A preferred solder alloy consists essentially of about 0.8 to about 3.2 weight % Cu, about 0.03 to about 0.25 weight % Al, and balance consisting essentially of Sn. A still more preferred embodiment of this solder alloy consists essentially of about 0.95 to about 3.0 weight % Cu, about 0.15 to about 0.20 weight % Al, and balance consisting essentially of Sn.

Another such modified embodiment involves an the alloy formulation to eliminate the Ag component for situations where higher solder melting alloys can be tolerated, where another illustrative embodiment of the invention provides a solder alloy consisting essentially of about 3.20-y weight % Cu, and y weight % Al and balance consisting essentially of Sn wherein y is about 0.15 to about 0.25 weight %.

The present invention also provides a solder joint and solder process that embody a Sn-optional Ag—Cu—Al alloy of the type discussed above. The solder joint has a microstructure that comprises tin dendrites, interdendritic multi-phase ternary eutectic, and pro-eutectic $Cu_6Sn_5$ particles adjacent and/or within the tin dendrites and is substantially devoid of $Ag_3Sn$ blades. The as-solidified solder joint microstructure typically includes an interfacial layer comprising $Cu_6Sn_5$ and an adjacent metastable Al-containing rejected solute region as a zone of intermediate hardness between the hard, brittle interfacial layer and the softer tin matrix of the solder microstructure to provide a beneficial hardness gradient that improves impact resistance. The interfacial layer resides between the copper substrate and the tin matrix. In an embodiment of the invention, relatively hard particles comprising Cu and Al, such as $Cu_{33}Al_{17}$, can be formed at the interfacial layer (i.e. in and/or adjacent the interfacial layer). The solder joint is formed by the solder being solidified on an electrical wiring board and/or about copper electrical conductors in illustrative embodiments of the invention.

The thermally-aged solder joint has an interfacial layer thickness that is about the same as the thickness as the interfacial thickness in the as-solidified condition (e.g. no more than 30% greater in thickness).

Solder joints made with the Sn-optional Ag—Cu—Al solder alloy may need to accommodate some minor addition of Pb due to reflow and mixing with Sn—Pb component lead plating during reflow assembly of solder joints. Slight contamination by such small Pb levels is not expected to raise the beneficial (about 217° C.) melting point of the Sn—Ag—Cu—Al solder alloys of the invention and may even help improve the wettability during joint formation. This type of Pb-tolerant behavior is an advantage over competing Sn—Ag—Bi (Pb-free) solders that run the risk of generating an extremely low melting Sn—Pb—Bi ternary eutectic, if alloyed with Sn—Pb component platings. It is expected that the global supply of "legacy" electronic components with Sn—Pb solder plating will continue to diminish and eventually vanish during the current transition to full Pb-free electronic soldering, but this possibility must be tolerated in any new Pb-free solders that are proposed.

The Sn—Ag—Cu—Al solder alloy exhibits a reduced melting point (solidus or melting temperature) of about 217° C. as compared to the melting points of Sn—Ag binary eutectic solder (221° C.), and the Sn—Cu binary eutectic solder (227° C.) and a narrow liquid-solid mushy zone with a liquidus temperature not exceeding about 5° C., preferably 3° C., above the solidus temperature for solderability. This significantly reduced melting point is a great advantage for solder assembly of electronic circuits and electrical systems. In the type of solder paste, reflow and ball grid array (BGA) applications that are envisioned for use with the Sn—Ag—Cu—Al solder, every single degree of reduced reflow temperature is a precious advantage for reducing damage to temperature sensitive electronic components and to the circuit board material, itself. In fact, a reason that SAC solder came into broad use as a Pb-free alternative to Sn—Pb solder is that the minimum reflow temperature of SAC solder for most applications, about 240° C., is just below the threshold for significant damage of one of the most popular circuit board materials, a fiberglass/epoxy composite, i.e., FR-4. Thus, the Sn—Ag—Cu—Al solder alloy pursuant to the present invention should permit a more comfortable margin for preventing thermal damage of most components and common circuit board materials.

The above advantages of the invention will become more readily apparent from the following detailed description taken with the following drawings.

BRIEF DESCRIPTION OF THE DRAWINGS

FIG. 4a illustrates a microprobe image of the as-solidified microstructure of the SAC3595+0.05% Al solder joint and shows a metastable, intermediate Al-containing rejected solute phase region adjacent to the $Cu_6Sn_5$ interfacial layer, while FIG. 4b illustrates the profile of the Sn, Cu, Ag, and Al concentrations (wt %) across the joint interface (in μm distance) of FIG. 4a, 5b, 7b (the interface between the Cu substrate and the solder is where the 100% Cu drops downwardly). In FIG. 4a, 5a, 7a, the Cu substrate is located on the left side of the microprobe image.

FIG. 5a illustrates another microprobe image of the as-solidified microstructure of the SAC3595+0.05% Al solder joint, while FIG. 5b illustrates the profile of the Sn, Cu, Ag, and Al concentrations (wt %) across the solder joint of FIG. 5a.

FIG. 7a illustrates a microprobe image of the thermally-aged (for 1000 hr at 150° C.) microstructure of the SAC3595+0.05% Al solder joint, while FIG. 7b shows the profile of Sn, Cu, Ag, and Al content (wt %) across the thermally-aged joint interface (in μm distance) of FIG. 7a (the interface being where the 100% Cu drops off).

DESCRIPTION OF THE INVENTION

Figure 1:
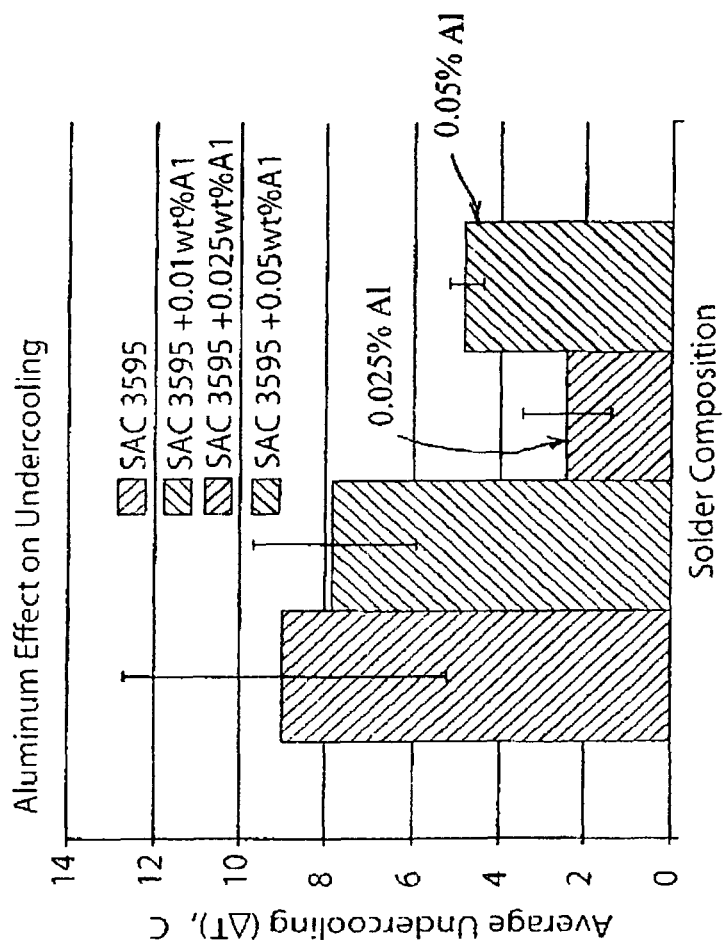
FIG. 1 is bar graph illustrating the effect of aluminum additions (in weight %) to SAC 3595 solder alloy on undercooling values for DSC (differential scanning calorimetry) measurements at 0.17° C./second cooling rate.

The present invention involves reducing the unusually high undercooling of SAC (Sn—Ag—Cu) solder joints described above, where there can be difficulty in nucleating Sn solidification as a pro-eutectic phase, especially during slow cooling, such as existing for ball grid array (BGA) joints. As mentioned above, increased undercooling of the solder joints can promote formation of undesirable pro-eutectic intermetallic phases, specifically $Ag_3Sn$ "blades," that tend to coarsen radically, leading to embrittlement of as-solidified solder joints. To this end, the present invention provides a solder alloy comprising Sn, Ag, Cu, and Al having an alloy composition controlled to provide a strong, impact-and thermal aging-resistant solder joint having beneficial microstructural features described below and substantially devoid of $Ag_3Sn$ blades. The solder alloy has a relatively low liquidus temperature and a narrow liquid-solid mushy zone for solderability.

In an illustrative embodiment of the invention, the solder alloy consists essentially of about 3 to about 4 weight % Ag, about 0.7 to about 1.7 weight % Cu, about 0.01 to about 0.25 weight % Al, and balance consisting essentially of Sn. The solder alloy preferably exhibits a relatively low solidus temperature of about 217° C.±1° C. and narrow liquid solid mushy zone with a liquidus temperature not exceeding about 5° C., often less than 3° C., above the solidus temperature. Other alloying elements may be present in the solder alloy that do not substantially affect the melting temperature thereof.

A preferred solder alloy pursuant to the invention consists essentially of about 3.4 to about 3.6 weight % Ag, about 0.8 to about 1.1 weight % Cu, about 0.03 to about 0.20 weight % Al, and balance consisting essentially of Sn.

A still more preferred solder alloy consists essentially of about 3.45 to about 3.55 weight % Ag, about 0.9 to about 1.0 weight % Cu, about 0.04 to about 0.10 weight % Al, and balance consisting essentially of Sn.

A still more preferred solder alloy consists essentially of about 3.45 to about 3.55 weight % Ag, about 0.75 to about 1.0 weight % Cu, about 0.04 to about 0.15 weight % Al, and balance consisting essentially of Sn.

Another illustrative embodiment of the invention provides a Pb-free solder alloy consisting essentially of about 3 to about 4 weight % Ag, 0.95-y weight % Cu, and y weight % Al and balance consisting essentially of Sn wherein y is about 0.01 to about 0.25 weight %.

Still another embodiment of the invention provides a still more preferred solder alloy consists essentially of about 3.45 to about 3.55 weight % Ag, about 0.80 to about 1.0 weight % Cu, about 0.10 to about 0.20 weight % Al, and balance consisting essentially of Sn, especially for BGA applications that involve thermal-mechanical fatigue environments, like avionics.

The invention also envisions a modification of the alloy formulation to eliminate the Ag component for situations where higher solder melting alloys can be tolerated. Such modified solder alloy embodiments are described below.

A still further illustrative embodiment of the invention provides a solder joint and solder process that embody a Sn—Ag—Cu—Al alloy of the type discussed above wherein the solder joint has a microstructure that comprises tin dendrites, interdendritic multiphase ternary eutectic (between the tin dendrites), and pro-eutectic $Cu_6Sn_5$ particles adjacent and/or within the tin dendrites and that is devoid of $Ag_3Sn$ blades. This microstructure is achievable at the relatively slow cooling rates employed for solder paste reflow and BGA solder processing.

The as-solidified solder joint microstructure includes an interfacial layer comprising $Cu_6Sn_5$ and preferably an adjacent metastable, intermediate Al-containing rejected solute region as a zone of intermediate hardness between the hard, brittle interfacial layer and the softer tin matrix of the solder microstructure to provide a beneficial hardness gradient therebetween. The interfacial layer resides between the copper substrate and the solder of the solder joint.

The solder joint is formed by the solder being solidified on an electrical wiring board and/or about copper electrical conductors in illustrative embodiments of the invention by various conventional soldering processes including, but not limited to, solder paste reflow and BGA.

A thermally-aged solder joint (e.g. aged for 1000 hours at 150° C.) pursuant to the invention has an interfacial layer thickness that is about the same as the thickness as the interfacial layer thickness in the as-solidified condition (e.g. no more than 30% greater in thickness). As a result, the solder joint is resistant to thermal aging-induced embrittlement.

For purposes of further illustrating the invention without limiting it, the present invention is described below with respect to modifying a near-eutectic alloy, SAC3595 solder alloy (Sn-3.5% Ag-0.95% Cu, in weight %) as a base by alloying with a fourth element, Al (aluminum) substituted for part of the Cu to reduce undercooling of solder joints. In modifying base SAC3595 solder alloy, Al was alloyed with the base solder alloy to promote nucleation of pro-eutectic $Cu_6Sn_5$ within the solder joint matrix (liquid alloy) in addition to its formation on the substrate interface, providing additional interfacial area for Sn nucleation. The Al addition also may strain the lattice of the $Cu_6Sn_5$ phase, in both pro-eutectic and interfacial layer phases, to make a more potent epitaxial nucleation catalyst for Sn, thus reducing the joint undercooling and the potential to form $Ag_3Sn$ blades, although applicants do not intend or wish to be bound by any theory in this regard.

The bulk undercooling measurements for the solder joints made from the SAC3595+Al alloys that were selected (i.e. Al=0.01%, 0.025% and 0.05% by weight) are summarized in FIG. 1. That is, solder alloys—Sn-3.5% Ag-0.94% Cu-0.01% Al; Sn-3.5% Ag-0.925% Cu-0.025% Al, Sn-3.5% Ag-0.90% Cu-0.05% Al in weight %—were tested. Each alloy was fabricated as a 100 g chill-cast ingot from component elements of 99.99% purity and drawn into solid wire of 1.7 mm diameter by the Materials Preparation Center of Ames Laboratory. For each Al concentration level tested, at least seven repeated trials were used.

FIG. 1 shows that the Al addition is an active catalytic addition since these concentrations of Al have relatively lower undercooling values as compared to the average undercooling of unmodified SAC3595 base solder alloy. The range of undercooling values for unmodified SAC3595 is indicated in FIG. 1 by the left-hand bar at the zero concentration, with the data spread indicated by the bracket. Al can be seen to have a potent and consistent nucleation effect. Note that the nucleation temperature ($T_{nuc}$) is defined as the onset point of the exothermic crystallization peak in each DSC thermogram, consistent with the literature in this field. Also, the bulk undercooling, $\Delta T$, is defined at the difference between the onset of melting at the solidus temperature ($T_{sol}$) and the onset of nucleation, i.e., $\Delta T=T_{sol}-T_{nuc}$. Also note that observation on heating in a differential scanning calorimeter (DSC) of the solidus temperature for a eutectic alloy is also the singular eutectic melting point, $T_{eut}$, and not just the start of a melting range between solidus and liquidus temperatures. The DSC apparatus used was a Pyris 1 power compensating DSC available from Perkin-Elmer wherein a pre-fluxed copper pan and copper lid accurately simulated a solder joint in the DSC test. The copper surfaces were cleaned with methanol and swabbed with flux (Johnson Mfg. No. 1 flux), and the fluxing action promoted on a hot plate at 180° C. Each pre-fluxed pan was loaded with a methonal cleaned thin disk of the selected solder alloy that weighed about 15 mg. After mild crimping, each pan sample was reflowed for one cycle in the DSC unit by heating at 10° C./min to a peak temperature of 240° C. for 30 seconds and cooling at 10° C./min (0.17° C./s) to ambient temperature to simulate BGA reflow cooling. At least seven separate (repeat) bulk undercooling ($\Delta T$) measurements ($T_{eut}-T_{nuc}=\Delta T$) were performed for each solder alloy.

Figure 2:
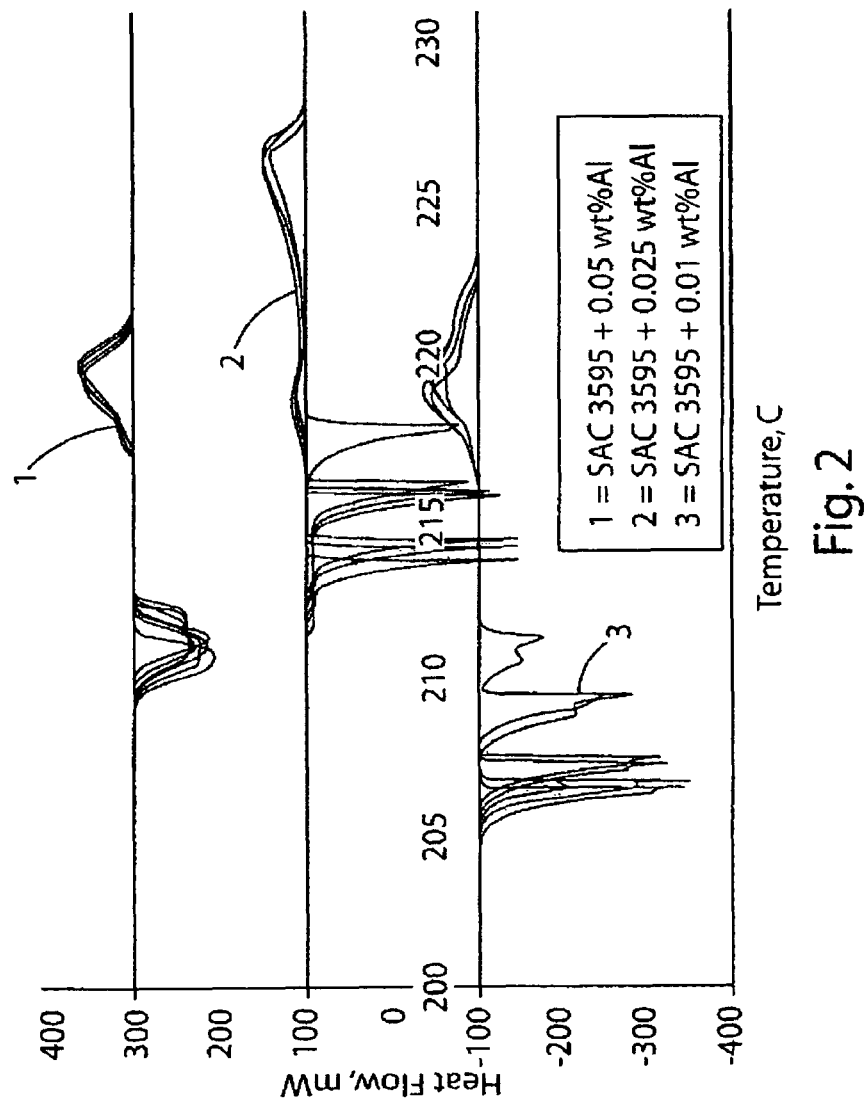
FIG. 2 shows a summary of DSC results for SAC3595+ 0.01% Al, SAC3595+0.025% Al, and SAC3595+0.05% Al solder joints (where % is weight %).

Referring to FIG. 2, the SAC3595+0.01% Al alloy had a solidus temperature of 216.5° C. and a liquidus temperature of about 222° C. The SAC3595+0.025% Al alloy had a solidus temperature of 217.5° C. and a liquidus temperature of 226.5° C. The SAC3595+0.05% Al alloy had a solidus temperature of 217° C. and a liquidus temperature of 220° C. Note that the SAC3595+0.025% Al alloy appears to acquire an anomolous higher melting behavior and, as such, is a less desirable solder alloy choice in this series. However, subsequent analytical chemistry testing revealed that this particular alloy did not exhibit the desired composition and that later experiments showed a very consistent trend in liquidus temperature and undercooling with neighboring compositions.

Figure 3A:
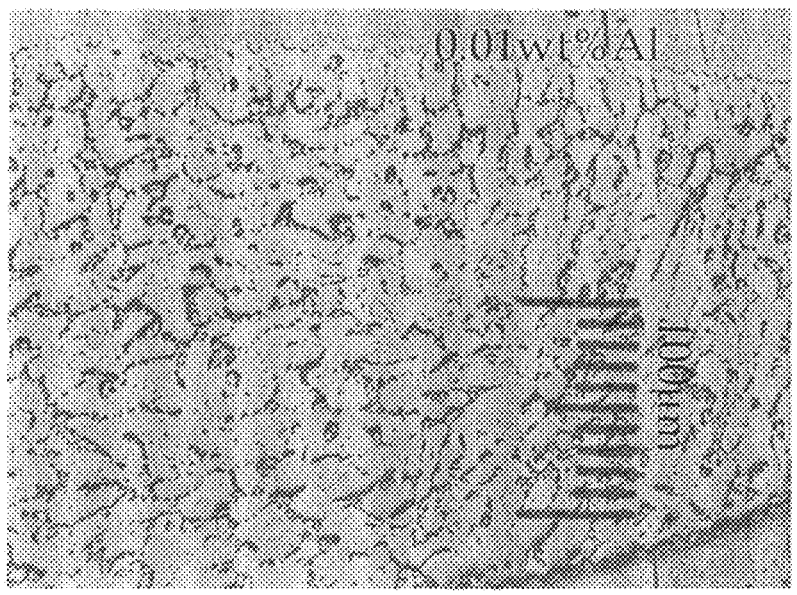
FIGS. 3a and 3b are photomicrographs of the as-solidified microstructure of the SAC3595+0.01% Al solder joint and the SAC3595+0.025% Al solder joint, respectively, cooled at 0.17° C./s in selected DSC tests wherein the as-solidified microstructure comprises tin dendrites, interdendritic ternary eutectic, and pro-eutectic $Cu_6Sn_5$ particles adjacent and/or within the tin dendrites and the microstructure is devoid of $Ag_3Sn$ blades.
Figure 3B:
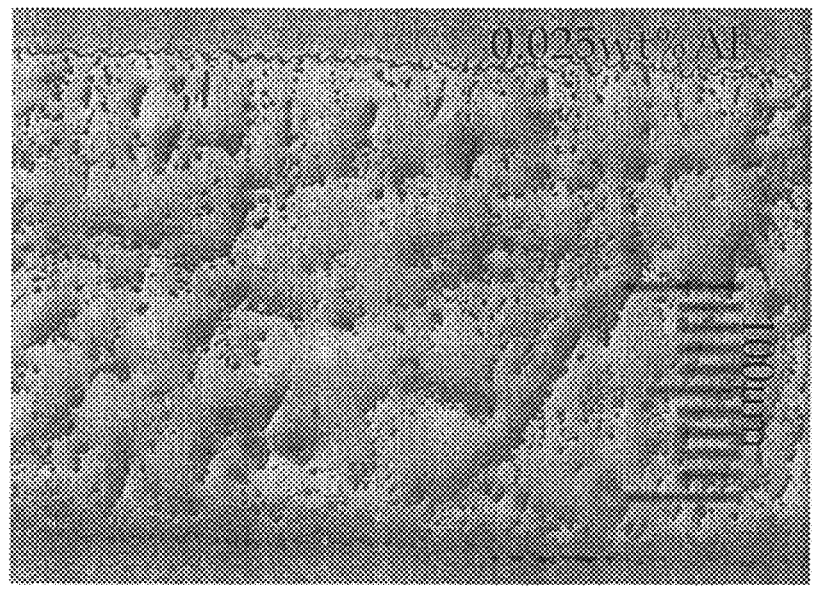

Referring to FIGS. 3a and 3b, the as-solidified microstructure of the SAC3595+0.01% Al solder joint and the SAC3595+0.025% Al solder joint, respectively, cooled at 0.17° C./s of a selected DSC test is comprised of tin dendrites, fine ternary eutectic between the tin dendrites, and pro-eutectic $Cu_6Sn_5$ particles adjacent and/or within the tin dendrites wherein the fine multiphase ternary eutectic includes a beta tin matrix with intermetallic phases, such as $Cu_6Sn_5$ and $Ag_3Sn$, distributed in the tin matrix and wherein the microstructure is devoid of $Ag_3Sn$ blades. An interfacial layer comprising $Cu_6Sn_5$ resides between the copper substrate and the solder in the as-solidified solder joint. The Cu substrate is located at the top and bottom of the photomicrograph.

Figure 3C:
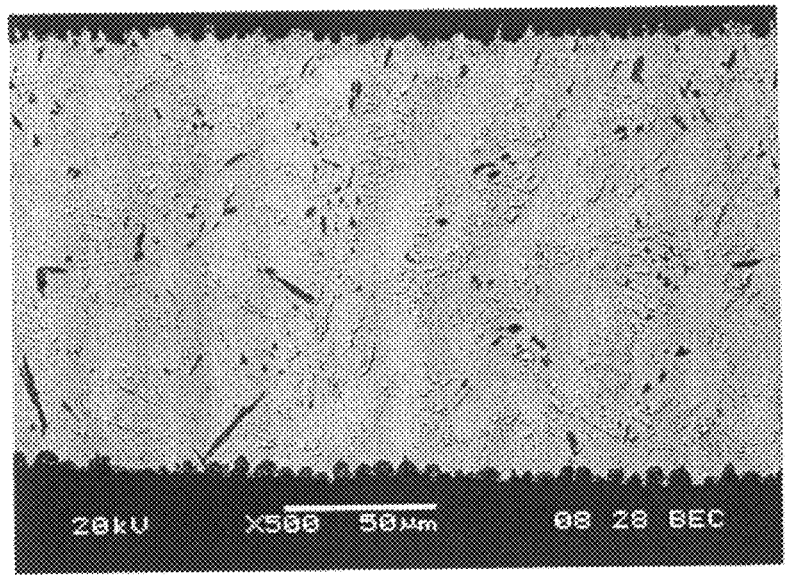
FIG. 3c is an SEM of the typical as-solidified microstructure of the SAC3595+0.05% Al solder/Cu joint cooled at 0.17° C./s of a selected DSC test.
Figure 3D:
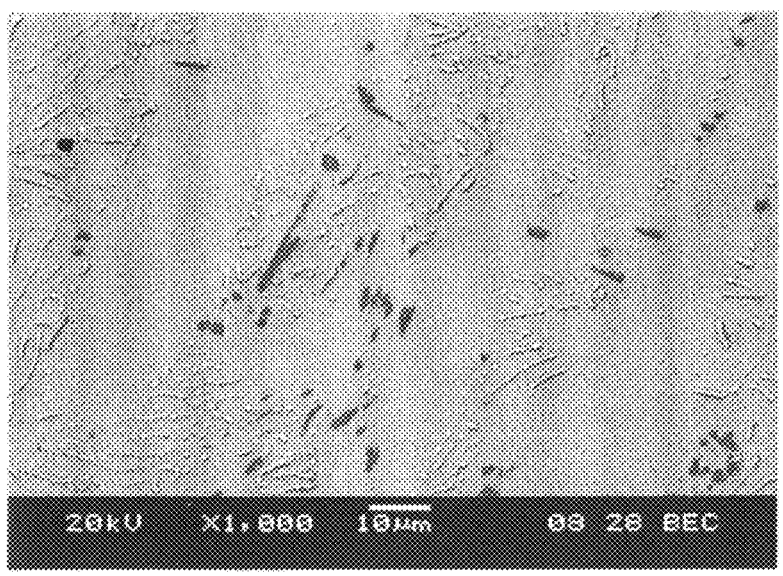
FIG. 3d is an SEM (scanning electron micrograph) in back scattered electron mode of the microstructure of FIG. 3c. The Cu substrate is located at the top and bottom of FIGS. 3a-3d.

Referring to FIGS. 3c and 3d, the typical as-solidified microstructure of the SAC3595+0.05% Al solder/Cu joint cooled at 0.17° C./s of a selected DSC test is comprised of the fine ternary eutectic between tin dendrites and pro-eutectic $Cu_6Sn_5$ particles adjacent and/or within the tin dendrites and is devoid of $Ag_3Sn$ blades.

FIG. 4a illustrates a microprobe image of the as-solidified microstructure of the SAC3595+0.05% Al solder joint and shows an interfacial layer comprising $Cu_6Sn_5$ and an adjacent metastable, intermediate Al-containing rejected solute-rich region (Sn—Ag—Cu—Al solid solution phase) as a zone between the $Cu_6Sn_5$ interfacial layer and the ternary eutectic microstructure. The $Cu_6Sn_5$ interfacial layer resides between the copper substrate and the solder in the as-solidified solder joint. FIG. 4b illustrates the profile of the Sn, Cu, Ag, and Al concentrations across the solder joint of FIG. 4a showing that the rejected solute phase region contains Sn—Cu—Ag—Al.

FIG. 5a illustrates another microprobe image of the as-solidified microstructure of the SAC3595+0.05% Al solder joint, while FIG. 5b illustrates the profile of the Sn, Cu, Ag, and Al concentrations across the solder joint of FIG. 5a. FIGS. 5a and 5b confirm that the rejected solute region is present as a zone between the $Cu_6Sn_5$ interfacial layer and the ternary eutectic microstructure. The rejected solute region is adjacent and separate from $Cu_6Sn_5$, the interfacial intermetallic layer in the as-solidified solder joint.

Figure 6:
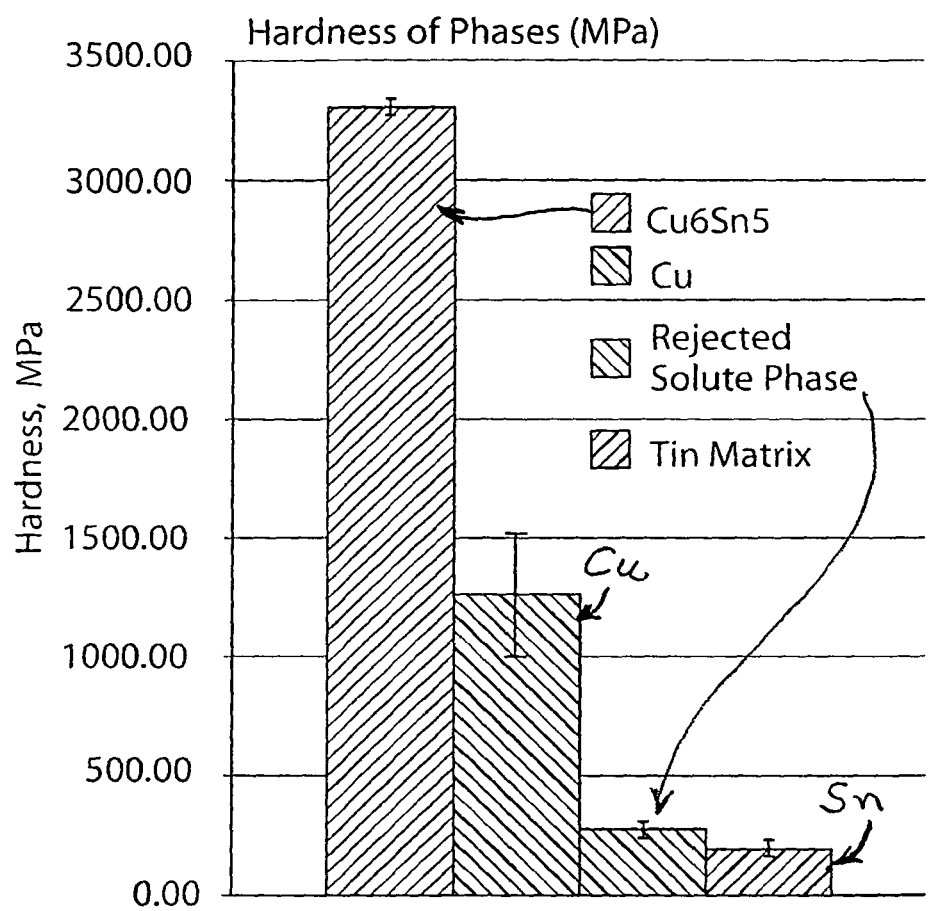
FIG. 6 illustrates nano-indentation hardness values of the $Cu_6Sn_5$ interfacial layer, Cu substrate metal, Al-containing rejected solute phase region, and the tin matrix measured within tin dendrites.

Referring to FIG. 6, measured nano-indentation hardness values of the $Cu_6Sn_5$ interfacial layer, Cu metal substrate, rejected Al-containing solute region, and the tin matrix measured within tin dendrites are shown. It is apparent that the rejected solute region exhibits a hardness intermediate between the hardness of the hard, brittle $Cu_6Sn_5$ interfacial layer and the softer tin matrix. The rejected solute region is about 44% harder than the tin matrix. The solder joint thus exhibits a hardness gradient from the hard, brittle interfacial layer toward the softer tin matrix that improves impact resistance of the solder joint, consistent with the well known benefits of typical gradient microstructures in other alloy or composite systems. The nano-indentation measurements were made using a procedure similar to that used for microhardness measurement (see J. Mater. Res., Vol. 7, No. 6, June 1992) and used a diamond "cube corner" indent tip.

Figures 7A, 7B:
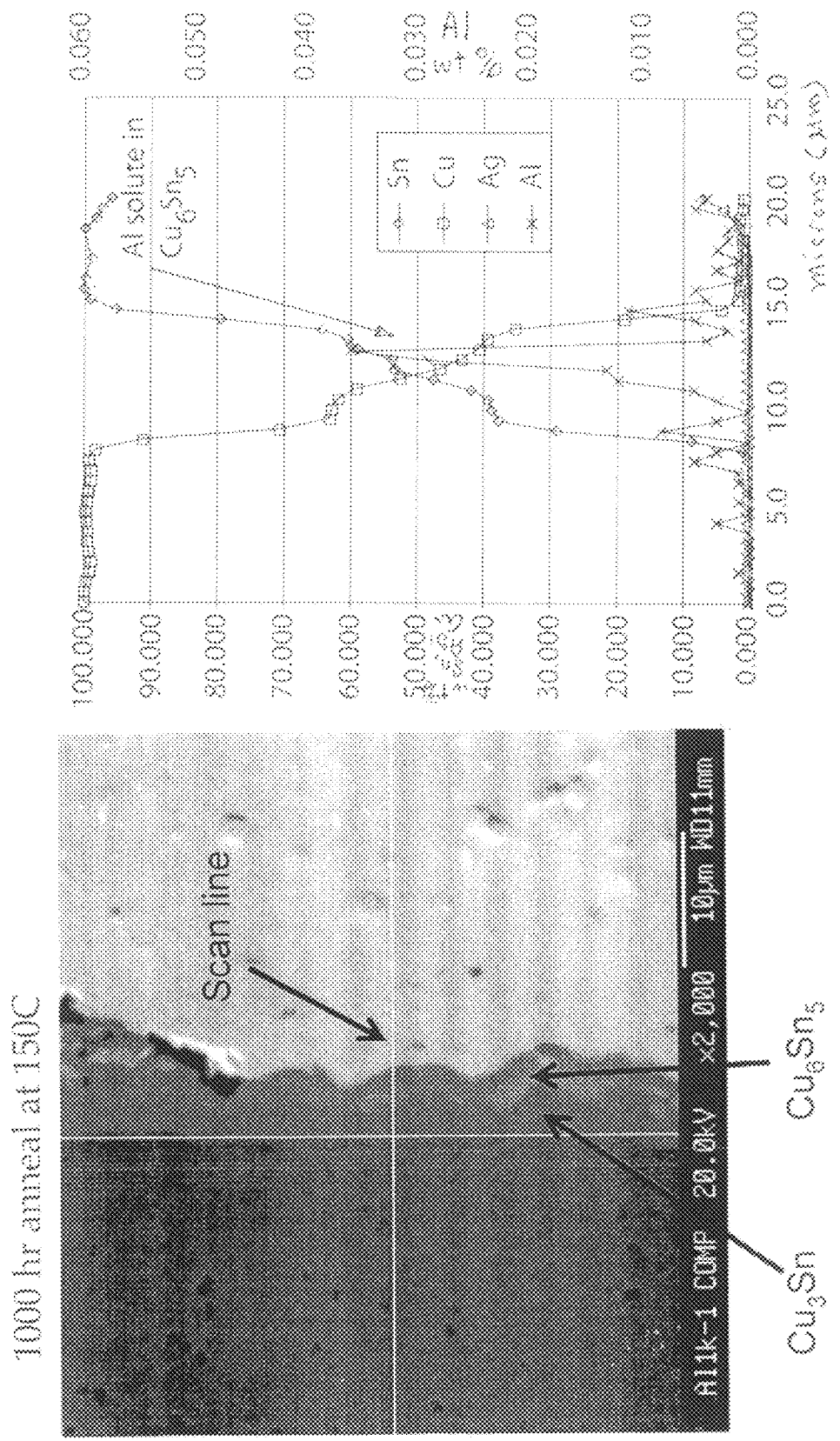

FIG. 7a illustrates a microprobe image of the thermally aged (for 1000 hr at 15000) microstructure of the SAC3595+ 0.05% Al solder joint. In FIG. 7a, the Cu substrate is located on the left side of the microprobe image. The thermally-aged solder joint has an interfacial layer thickness that is about the same as the thickness as the interfacial thickness in the as-solidified condition (e.g. no more than 30% greater in thickness) so as to improve thermal aging embrittlement resistance of the solder joint. The interfacial layer of the thermally aged solder joint comprises an outer $Cu_3Sn$ layer (adjacent to the Cu substrate) and an inner $Cu_6Sn_5$ layer.

FIG. 7b illustrates the profile of respective Sn, Cu, Ag, and Al concentrations across the thermally aged solder joint of FIG. 7a. The aluminum of the rejected solute phase region has become incorporated into the inner $Cu_6Sn_5$ interfacial layer The solder alloy pursuant to the invention is useful for joining electronic assemblies and electrical contacts and to substitute for Pb-containing solders in all surface mount solder assembly operations, including solder paste reflow and ball grid array joints.

Figure 8:
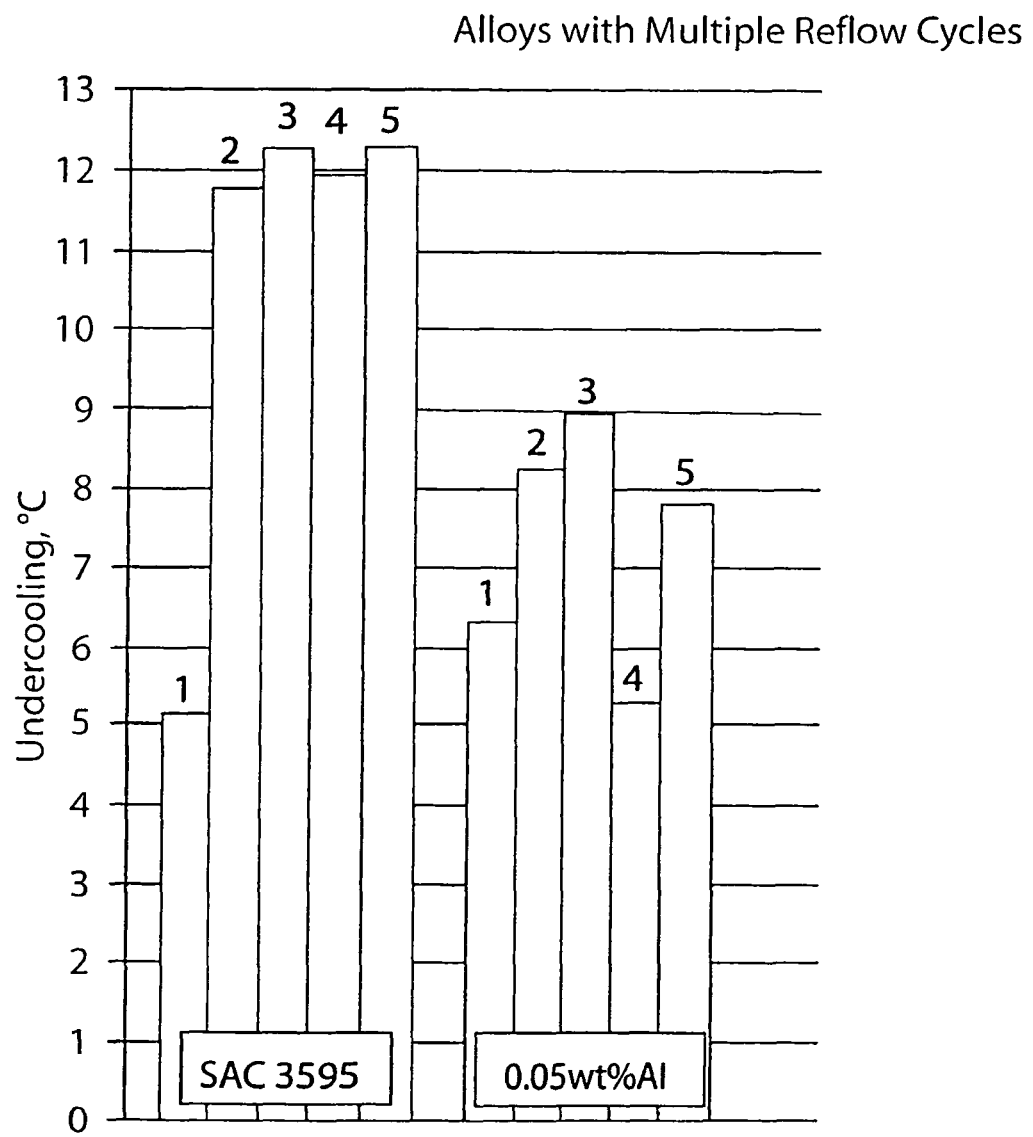
FIG. 8 is a bar graph showing undercooling values (° C.) for SAC 3595 and SAC 3595+0.05 wt % Al with multiple reflow cycles. For each alloy, five cycles were conducted wherein each cycle involved raising the temperature from 160° C. to 240° C. with a 30 second dwell followed by cooling from 240° C. to 160° C. at heating and cooling rates of 0.17° C./second.

FIG. 8 is a bar graph showing undercooling values (° C.) for SAC 3595 and SAC 3595+0.05 wt % Al with multiple reflow cycles. For each alloy, five cycles were conducted wherein each cycle involved raising the temperature from 160° C. to 240° C. with a 30 second dwell followed by cooling from 240° C. to 160° C. at heating and cooling rates of 1° C./min and 0.17° C./second, respectively. The average undercooling value for the SAC 3595+0.05 wt % Al was 7.3° C. and generally was much smaller than the undercooling values for SAC 3595 after multiple reflow cycles.

Shear strength also was measured by an asymmetric four-point bend (AFPB) method (see O. Unal, I. E. Anderson, J. L. Harringa, R. L. Terpstra, B. A. Cook, and J. C. Foley, J. Electron. Mater. 30, 1206 (2001) for larger solder joint specimens made with selected SAC 3595+Al alloys by hand-soldering with solid solder wire. The larger specimens (3 mm×4 mm×75 μm gap) were reflowed at a peak temperature of 255° C. for 30 seconds and cooled at 1° C./s to 3° C./s to simulate typical surface mount (paste reflow) soldering processes. AFPB specimens (seven samples for each condition) were tested as-solidified and after thermal aging at 150° C. for up to 1,000 h. Microstructural analysis of the post-AFPB test specimens was performed with SEM on cross-sectioned metallographic specimens that were polished (ending with an aqueous slurry of 0.05-μm $SiO_2$) and ion milled to provide information on the failure mechanisms.

Results on solder joints made from Sn-0.95 wt. % Cu (SC95) were used as a baseline. It should be noted that the large size of the Cu portion of the shear strength specimens for AFPB testing prevented them from having their undercooling measured in a calorimeter. However, the cooling rate for these specimens (quenched on a massive Cu block) is about nine times faster through the solidification temperature range, which has a tendency to promote higher undercooling but does not typically allow time for massive growth of any $Ag_3Sn$ blades that may nucleate. To cover this uncertainty in knowledge of the undercooling of these joints, the microstructure of selected specimens of each alloy was examined after testing and there was a confirmed absence of $Ag_3Sn$ blades.

The most notable feature of the shear strength comparison is that the as-soldered (unaged) results for SAC3595+0.05% Al and SC95 were nearly identical at about 30 MPa and were lower than SAC3595 (about 41 MPa).

Further, the thermally aged strength for SAC3595+0.05% Al was nearly constant at about 30 MPa out to 500 h of aging at 150° C. and only slightly less (29 MPa) at 1000 h. The shear strength of the of the SAC3595 and SAC3595+0.05% Al alloys seems to converge at about 30 MPa after 1,000 h of aging at 150° C. All joints show localized ductile shear failure at about 30 MPa after 1000 at 150° C.

A comparison of SC95 and SAC3595+0.05% Al revealed that they start at about the same moderate shear strength, but the strength retention for SAC3595 modified by 0.05% Al is significantly better than the unalloyed SC95. The unaged and aged samples all exhibited localized ductile shear failures. Inspection of all the shear test stress-strain curves and microstructural examination of the weakest post-shear test joints (of seven repeat samples of each alloy) indicated that the Al additions effectively suppressed the nucleation and coalescence of pores that can embrittle SAC solder joints after prolonged high-temperature exposure. The relatively low initial shear strength and excellent strength retention results for the SAC 3595+0.05% Al solder appear to relate to the exceptional stability of the coarse Sn dendrites and fairly stable interdendritic ternary eutectic microstructure after thermal aging at 150° C. The Sn—Ag—Cu—Al solder alloy of the present invention should be useful for low temperature reflow of Pb-free solder paste and BGA balls (e.g. spheres) as well as other soldering applications. Another important advantage of the Sn—Ag—Cu—Al solder pursuant to the invention involves reduction or avoidance of the formation of $Ag_3Sn$ blades in the as-solidified solder joint microstructure. Analysis of all of the solder joint samples for the full range of Al additions revealed that a minimum of 0.05% by weight Al appears to completely suppress $Ag_3Sn$ blade phase formation, even at the slow cooling rate that is common for BGA assembly. This high level of control of the solder joint microstructure should produce superior results in board level impact conditions.

Figure 9:
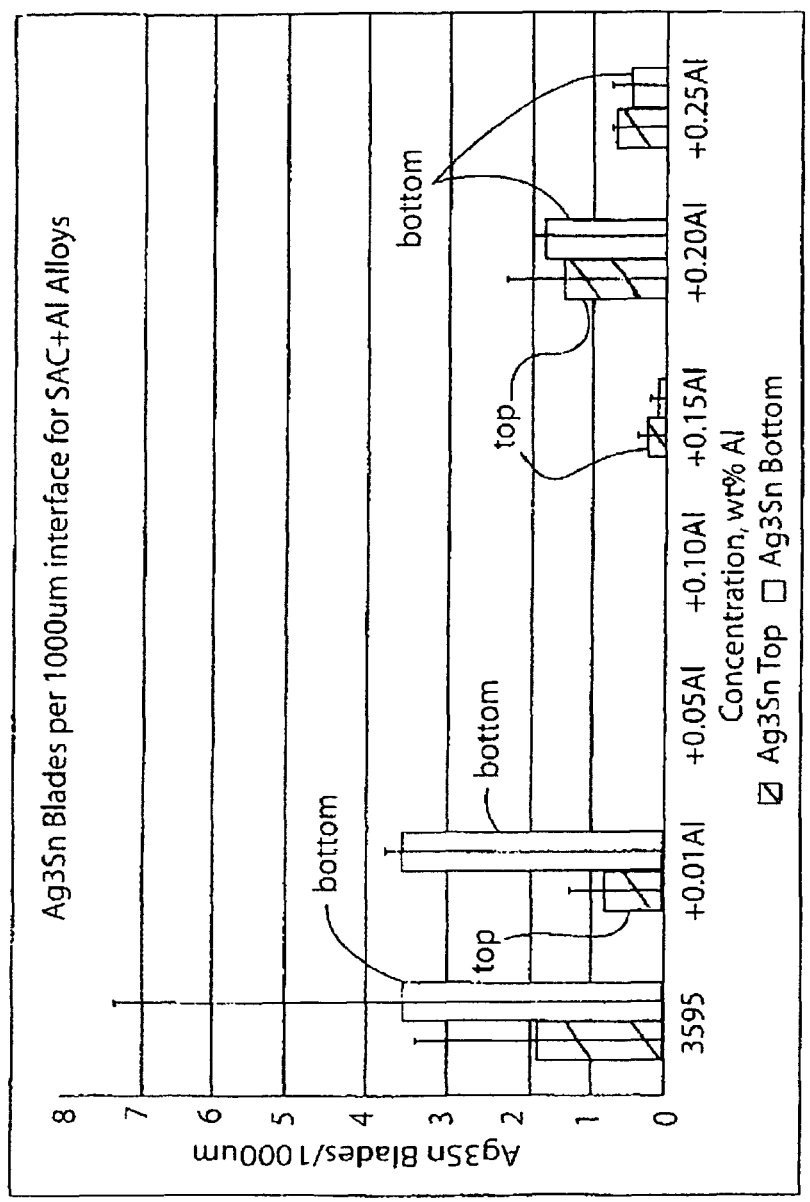
FIG. 9 is a bar graph showing $Ag_3Sn$ blades counts per 1000 μm of interface for SAC+Al alloys for each solder alloy tested with different Al contents.

More detailed $Ag_3Sn$ blade counting for the alloys was conducted on visible $Ag_3Sn$ blades seen protruding from either the top or bottom of each calorimetric joint interface. Blades of a length that were ≥50 µm were recorded in FIG. 9. The total number of blades was counted per DSC joint, as well as the total interface length per DSC pan. From these values for $Ag_3Sn$ blades, the number of blades per 1000 µm of interface was graphed for each alloy. $Ag_3Sn$ blades were prevalent in the baseline SAC3595 alloy, as well as for the 0.010% Al concentration. Blade suppression was seen for the alloys with additions of aluminum of 0.05 wt % or greater, but blades became visible again at the higher concentrations. Blades were seen slightly more frequently on the bottom interface than at the top interface at lower concentrations, but also had a greater deviation per sample. At aluminum concentrations of 0.15, 0.20, and 0.25, the $Ag_3Sn$ blade formation was more consistent per sample and was just as likely to occur on the top interface as the bottom. The need for an $Ag_3Sn$ blade suppressant can be seen clearly for the baseline SAC 3595 alloy where a wide variation in the number of blades can be seen.

Figure 10:
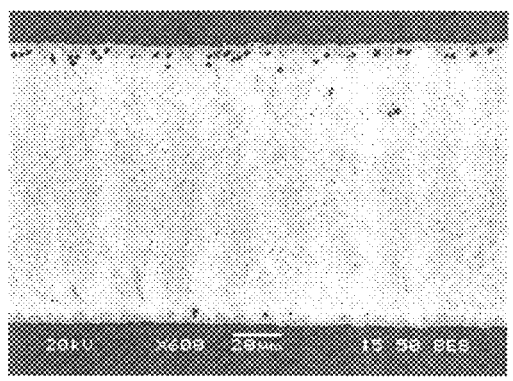
FIG. 10 is a scanning electron micrograph (SEM) illustrating dark, dispersed phase seen on top surface of SAC+ 0.20Al.
Figure 11:
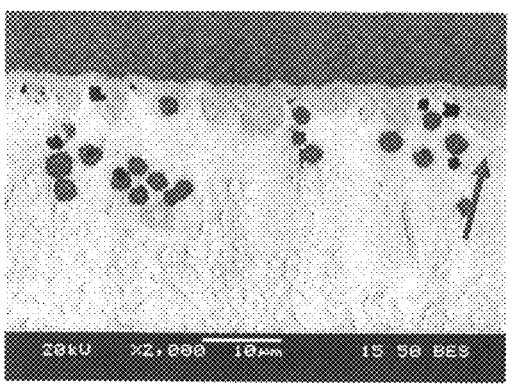
FIG. 11 is a SEM illustrating scratches and pullout from new IMC phase indicated by arrows.

In addition, as aluminum concentration increased beyond 0.15Al, an increase in ternary eutectic phase fraction was seen, as well as the appearance of a new small equiaxed (<5 µm) phase. In the SEM, EDS analysis indicated that the composition of the small equiaxed particles was slightly enriched in Cu, beyond a 2:1 ratio of Cu:Al. Comparison to the Cu—Al phase diagram and an extensive analysis of X-ray diffraction results revealed that the particles were probably $Cu_{33}Al_{17}$ phase. As shown in FIGS. 10 and 11, the particles can be seen either in direct contact with the $Cu_6Sn_5$ interfacial layer, attached to the copper substrate, or adjoined to pro-eutectic $Cu_6Sn_5$. The particle phase appears dark in an SEM when observed in backscattered electron mode. The size of this phase varies from 2-5 µm with an average size near 3 µm.

Figure 12:
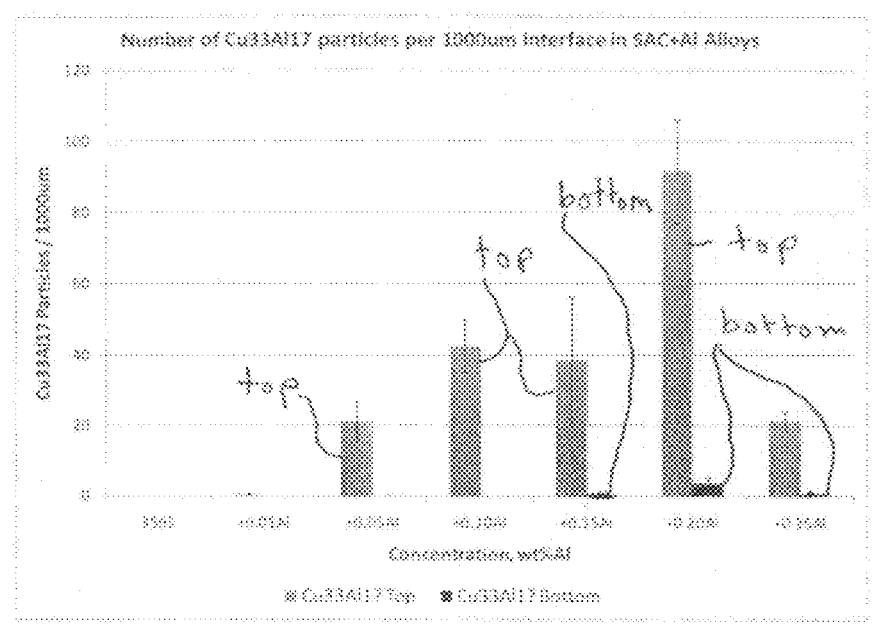
FIG. 12 is a bar graph illustrating prevalence of $Cu_{33}Al_{17}$ particles per 1000 μm of interface for SAC+Al alloys that were tested.

WDS analysis of the particles determined the composition to be 62.2 at. % Cu-37.22 at. % Al-0.60 at. % Sn and it matches closely with the $Cu_{33}Al_{17}$ phase from X-ray results and the initial EDS analysis. Further examination of the $Cu_{33}Al_{17}$ was needed, and was conducted on SAC 3595+0.20 Al, the alloy that contained the most $Cu_{33}Al_{17}$ particles of any of the given alloys (see FIG. 12). When examining Cu substrate/solder interfaces in the SEM at high magnification on backscattered electron mode, it can be seen that the new $Cu_{33}Al_{17}$ phase is faceted, hexagonal in shape and primarily on the top surface (lid side) of the calorimetric joints. In addition, the phase fraction of $Cu_{33}Al_{17}$ particles can also be seen in FIG. 12 as a function of Al content. The total number of particles were counted per DSC joint, as well as the total interface length per DSC pan. From these values for $Cu_{33}Al_{17}$ phase particles, the number of particles per 1000 µm of interface was graphed for each solder alloy.

$Cu_{33}Al_{17}$ particles show a different trend with composition than $Ag_3Sn$ blade formation. In other words, the phase fraction of particles increases with increasing aluminum until it reaches an apex at 0.25 wt %, then the $Cu_{33}Al_{17}$ content drops to a level comparable to 0.05 Al. Conversely, the suppression of $Ag_3Sn$ blades is only completely effective for intermediate levels of Al additions, 0.05 Al and 0.10 Al. To explain this behavior partially, one can observe that the formation of $Cu_{33}Al_{17}$ particles not only depletes the intentional Al addition, but also reduces the Cu concentration (about 2× faster, in at. %) in the molten solder alloy of the solder joint. Assuming that the formation of $Cu_{33}Al_{17}$ particles is as beneficial as the suppression of $Ag_3Sn$ blades, there appears to be a "sweet spot" in Al content that is centered between about 0.05 Al and 0.15 Al. However, with higher Al additions, there is increasingly less available Cu because of the substitutional alloying approach and because the $Cu_{33}Al_{17}$ particle formation depletes Cu rapidly. Therefore, less $Cu_{33}Al_{17}$ particles are formed at 0.25 Al. It should be noted that a minor extension of the sweet spot to higher Al could be realized if the Cu content was not reduced substitutionally with the Al addition, i.e., maintained at 0.95 Cu, without permitting a significant rise in the solder liquidus temperature.

A significant piece of data (in FIG. 12) was that 98% of all particles seen in the SAC3595+Al were found on the top interface (lid side of the DSC pan sample). Such an observation suggests that the particles are affected by gravity and that a buoyancy effect was seen for the particles in the solder joint microstructures. This buoyancy explanation for segregation of the $Cu_{33}Al_{17}$ particles is consistent with their density, 6.45 g/cm$^3$, which is less than the 6.99 g/cm$^3$ for liquid Sn. Thus, this type of buoyancy driven segregation of the particles implies that the $Cu_{33}Al_{17}$ particles nucleate early in the Sn alloy liquid of the solder joint and float to the top of the joint before solidification of the Sn and other phases.

Figure 13:
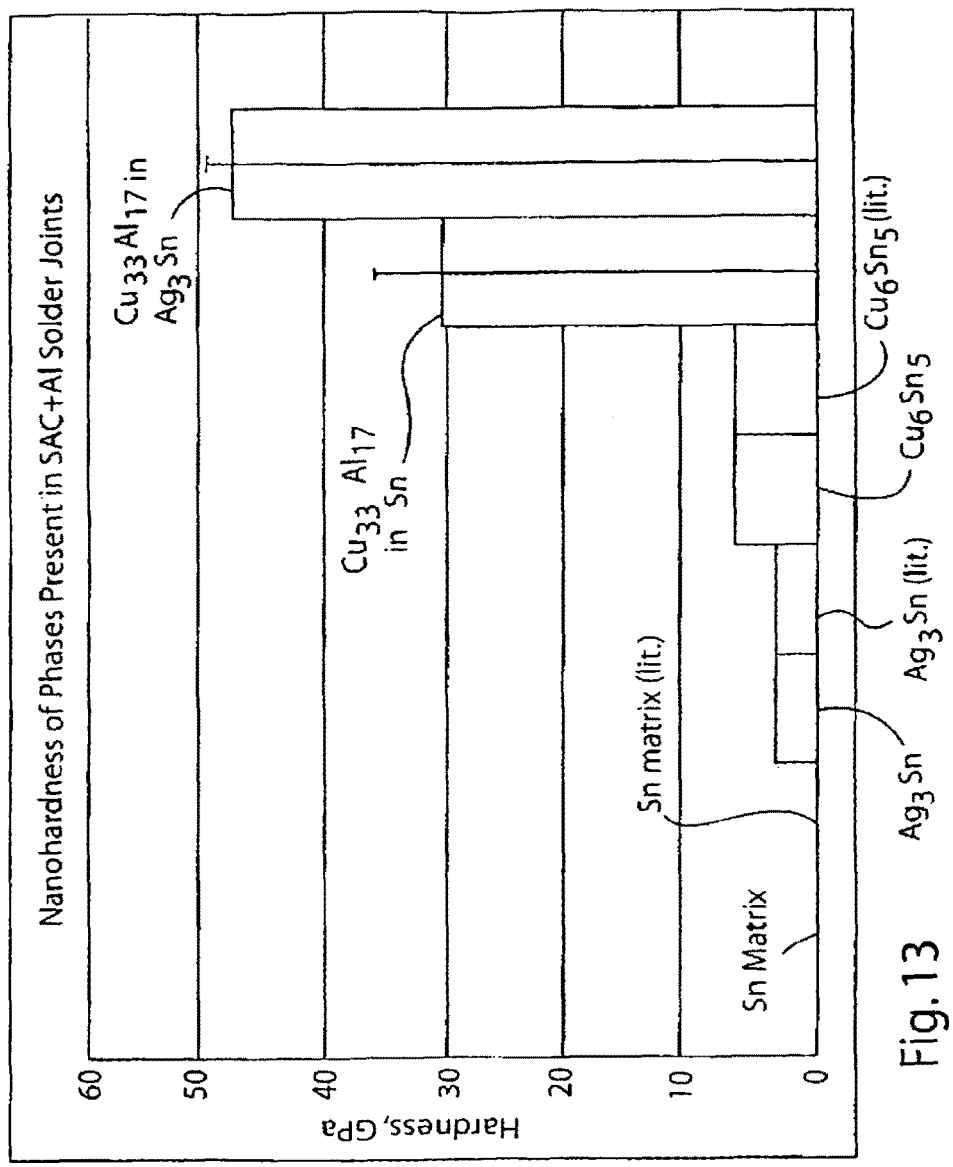
FIG. 13 is a bar graph illustrating nanohardness measurements showing hardness of $Cu_{33}Al_{17}$ phases and other solder joint solidification product phases taken in tin and in $Ag_3Sn$ blade phase regions. Sn matrix(lit.) and $Ag_3Sn$(lit.) are published literature values.

As seen FIG. 11, gouges and unusual scratches were seen in micrographs of SAC3595+Al alloys. The location of scratches were often correlated with areas that exhibited pullout of the $Cu_{33}Al_{17}$ phase. With this idea in mind, nanohardness measurements were performed on the particles and the other microstructural phase constituents to *determine their relative hardness (see FIG. 13). This set of nanohardness measurements was made on a SAC3595+0.20 Al DSC joint, using the same cube corner indenter and load as the previous measurements. The hold time at maximum load was set at 10 seconds for this set of measurements. The largest effect of creep during nanoindentation is the initial penetration, so by increasing the hold time, time dependent effects like creep are lessened. These measurements of increased accuracy (shown in FIG. 13) were made in the tin matrix, on an $Ag_3Sn$ blade, of the $Cu_6Sn_5$ phase, and on the $Cu_{33}Al_{17}$ particles. Actually, two types of measurements were made for the $Cu_{33}Al_{17}$ particles; one was for particles engulfed by an $Ag_3Sn$ blade and the other type were made on particles supported apparently by the tin solder matrix. The hardness measurements made on the particles in the tin matrix were 31.4±5.8 GPa compared to particles in the $Ag_3Sn$ blade that were 49.1±2.5 GPa. The difference in apparent hardness can be attributed to the hardness of the phase surrounding the particles. The relatively soft tin matrix has more compliance and is more ductile than the harder $Ag_3Sn$ IMC. The true hardness of the particles is most likely closer to the hardness found of $Cu_{33}Al_{17}$ in $Ag_3Sn$ rather than $Cu_{33}Al_{17}$ in Sn. Because these $Cu_{33}Al_{17}$ particles do meet the definition of "superhard" particles, greater than 40-50 GPa, it is also useful to speculate that they might impart high wear resistance to a solder joint that is ground to expose the particles at the top of the joint or that the particles may be extracted and placed in another matrix for a cutting tool application.

One worthwhile implication of the observations of hard particles that float to the top of a solder joint, doped with Al, is that certain types of thermal-mechanical fatigue (TMF)

environments, especially in BGA joints, could benefit from the suppression of fatigue crack propagation by this type of microstructural feature. Hard $Cu_{33}Al_{17}$ particles of the observed size (about 3 μm) could be very effective at reducing Sn grain boundary cracking, which is the normal TMF failure mechanism for Pb-free solder joints, particularly along the top of BGA joints. Thus, one of the sweet spot alloys, perhaps SAC3595+0.10 Al (or one with higher Cu and slightly higher Al) could be the optimum alloy for BGA joints that must resist high TMF conditions.

Another implication of the work on these alloys is that the Ag content of the SAC3595+Al alloys does not seem to participate in the suppression of undercooling by heterogeneous nucleation or in the generation of the beneficial hard particles. Thus, the invention envisions to modify the alloy formulation to eliminate the Ag component for situations where higher melting solder alloys can be tolerated. For example, an embodiment of such modified Sn—Cu—Al solder alloy consists essentially of about 0.7 to about 3.5 weight % Cu, about 0.01 to about 0.25 weight % Al, and balance consisting essentially of Sn. A more preferred solder alloy consists essentially of about 0.8 to about 3.2 weight % Cu, about 0.03 to about 0.25 weight % Al, and balance consisting essentially of Sn. A still more preferred embodiment of this solder alloy consists essentially of about 0.95 to about 3.0 weight % Cu, about 0.15 to about 0.20 weight % Al, and balance consisting essentially of Sn.

Still another such modified embodiment involves an alloy formulation to eliminate the Ag component for situations where higher solder melting alloys can be tolerated, where another illustrative embodiment of the invention provides a Sn—Cu—Al solder alloy consisting essentially of about 3.20-y weight % Cu, and y weight % Al and balance consisting essentially of Sn wherein y is about 0.15 to about 0.25 weight %.

Figure 14:
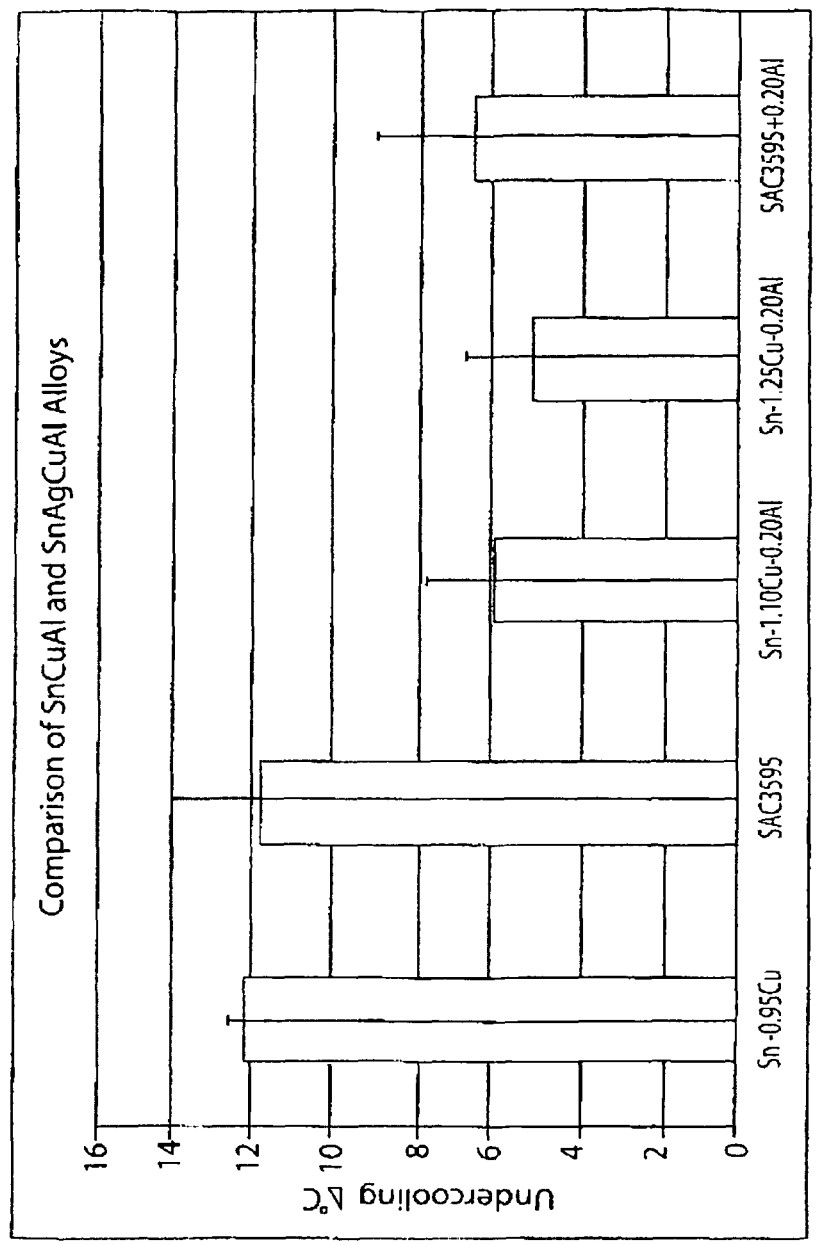
FIG. 14 is a bar graph summary of the undercooling results for the indicated alloys in one reflow cycle tests in DSC solder joints.

This embodiment of the invention has been tested and FIG. 14 shows the undercooling results in a comparison of the baseline SAC3595 and the baseline Sn-0.95 Cu with one Al level (0.20 Al) added to two different near-eutectic Sn—Cu alloys, along with the undercooling for SAC3595+ 0.20 Al that was reported earlier. The suppression of undercooling in these Sn—Cu solder alloys with the same Al addition is very similar to the SAC+Al alloy and this could produce the same type of microstructure control benefits in higher melting (solidus of 227° C.) solder joints.

While the invention has been described in terms of specific embodiments thereof, those skilled in the art will appreciate that modifications and changes can be made thereto within the scope of the appended claims.

REFERENCES, which are incorporated herein by reference:

K. N. Tu, A. M. Gusak, and M. Li, J. Appl. Phys. 93, 1335 (2003).
S. K. Kang, P. A. Lauro, D.-Y. Shih, D. W. Henderson, and K. J. Puttlitz, IBM J. Res. Dev. 49, 607 (2005).
C. Anderson, Z. Lai, J. Liu, H. Jiang, and Y. Yu, Mater. Sci. Eng. A 394, 20 (2005). I. E. Anderson, J. Mater Sci. Mater. Electron. 18, 55 (2007).
K.-W. Moon, W. J. Boettinger, U. R. Kattner, F. S. Biancaniello, and C. A. Handwerker, J. Electron. Mater. 29, 1122 (2000).
D. Swenson, J. Mater. Sci. Mater. Electron. 18, 3954 (2007).
I. E. Anderson, J. K. Walleser, and J. L. Harringa, JOM 59, 38 (2007).
W. Liu and N.-C. Lee, JOM 59, 26 (2007).
W. Liu, P. Bachorik, and N.-C. Lee, Proc. 58th Electron. Comp. Tech. Conf. (IEEE, 2008), pp. 627-635.
S. K. Kang, M. G. Cho, P. Lauro, and D.-Y. Shih, J. Mater. Res. 22, 557 (2007).
I. E. Anderson, J. C. Foley, B. A. Cook, J. L. Harringa, R. L. Terpstra, and O. Unal, J. Electron. Mater. 30, 1050 (2001).
J. K. Walleser (M. S. thesis, Mat. Sci. & Eng. Dept., Iowa State University, 2008.
I. E. Anderson and J. L. Harringa, J. Electron. Mater. 35, 113 (2006).
A. Ohno and T. Motegi, J. Jpn Inst. Metals 37, 777 (1973). Materials Preparation Center, A. L., US DOE Basic Energy Sciences, Ames, Iowa, USA. Available from: www.mpc. ameslab.gov.
O. Unal, I. E. Anderson, J. L. Harringa, R. L. Terpstra, B. A. Cook, and J. C. Foley, J. Electron. Mater. 30, 1206 (2001).
I. E. Anderson, J. L. Harringa, and J. K. Walleser, Proc. 4th Int. Braz. Solder Conf (ASM Int./AWS, 2009), pp. 6873, ISBN: 978-0-87171-751-1.
S. K. Kang, W. K. Choi, D.-Y. Shih, D. W. Henderson, T. Gosselin, A. Sarkhel, C. Goldsmith, and K. J. Puttlitz, JOM 55, 61 (2003).
J. M. Song, J.-J. Lin, C.-F. Huang, and H.-Y. Chuang, Mater. Sci. Eng. A 466, 9 (2007).
E. De Monlevade and W. Peng, J. Electron. Mater. 36, 783 (2007).
K. S. Kim, S. H. Huh, and K. Suganuma, J. Alloys Comp. 352,226 (2003).
S. K. Kang, JOM 55, 61 (2003).
I. De Sousa, D. W. Henderson, L. Patry, S. K. Kang, and D-Y. Shih, Proc. 56th Electron. Comp. Tech. Conf. (IEEE, 2006), pp. 1454-1461, ISBN: 1-4244-0152-6.

The invention claimed is:

1. A solder alloy that is solidified on an electrically conductive substrate comprising copper, said solder alloy consisting essentially of 0.95 to about 3.5 weight % Cu, from 0.15 to about 0.25 weight % Al, and balance consisting essentially of Sn, wherein the Al promotes nucleation of pro-eutectic $Cu_6Sn_5$ within the solder alloy which pro-eutectic $Cu_6Sn_5$ provides additional interface area for Sn nucleation, said solder alloy providing reduced undercooling that is less an 8 degrees C. upon solder solidification on the electrically conductive substrate as compared to a solder alloy free of Al.

2. A solder alloy that is solidified on an electrically conductive substrate comprising copper, said solder alloy consisting essentially of about 0.95 to about 3.05 weight % Cu, 0.15 to about 0.25 weight Al, and balance consisting essentially of Sn, wherein the Al promotes nucleation of pro-eutectic $Cu_6Sn_5$ within the solder alloy which nucleation, said solder alloy providing reduced undercooling that is less then 8 degrees C. upon solder solidification on the electrically conductive substrate as compared to a solder alloy free of Al.

3. A solder alloy consisting essentially of 0.95 to about 3.5 weight % Cu, from 0.20 to about 0.25 weight % Al, and balance consisting essentially of Sn, said solder alloy providing reduced undercooling upon solder solidification on an electrically conductive substrate comprising copper as compared to the solder alloy free of Al, wherein said reduced undercooling is less than 8 degrees C. upon solder solidification.

* * * * *